(12) United States Patent
Kanskar et al.

(10) Patent No.: US 9,966,731 B2
(45) Date of Patent: May 8, 2018

(54) CRYOGENIC COOLING OF DIODE LASER WITH COOLANT RECOVERY

(71) Applicant: nLIGHT Photonics Corporation, Vancouver, WA (US)

(72) Inventors: Manoj Kanskar, Portland, OR (US); Walter R. Sanders, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 406 days.

(21) Appl. No.: 14/873,049

(22) Filed: Oct. 1, 2015

(65) Prior Publication Data

US 2018/0083418 A1 Mar. 22, 2018

Related U.S. Application Data

(60) Provisional application No. 62/058,527, filed on Oct. 1, 2014.

(51) Int. Cl.
| | |
|---|---|
| *H01S 5/02* | (2006.01) |
| *H01S 5/024* | (2006.01) |
| *H01S 5/042* | (2006.01) |
| *H01S 5/40* | (2006.01) |
| *F25D 19/00* | (2006.01) |
| *H01M 8/04082* | (2016.01) |
| *F02C 3/22* | (2006.01) |
| *F25B 19/00* | (2006.01) |

(52) U.S. Cl.
CPC ............ *H01S 5/02423* (2013.01); *F02C 3/22* (2013.01); *F25B 19/005* (2013.01); *F25D 19/006* (2013.01); *H01M 8/04201* (2013.01); *H01S 5/024* (2013.01); *H01S 5/0207* (2013.01); *H01S 5/042* (2013.01); *H01S 5/40* (2013.01); *F05D 2220/32* (2013.01); *F25B 2400/12* (2013.01)

(58) Field of Classification Search
CPC .. H01S 5/02423; H01S 5/024; H01S 5/02407; H01S 5/0243; H01S 5/042; H01S 5/40; F02C 3/22; F25B 19/005; F25B 2400/12; F25D 19/006; H01M 8/04201; F05D 2220/32
See application file for complete search history.

(56) References Cited

U.S. PATENT DOCUMENTS 7,466,731 B2 12/2008 Rothenberg et al.

OTHER PUBLICATIONS

W.C. Reynolds, Thermodynamic properties in SI—graphs, tables and computational equations for 40 substances, Stanford University, Department of Mechanical Engineering, Stanford, CA, p. 51 (1979).

*Primary Examiner* — Armando Rodriguez
(74) *Attorney, Agent, or Firm* — Klarquist Sparkman, LLP

(57) ABSTRACT

A laser system includes a plurality of diode lasers, a cryogenic cooling system circulating a cryogenic coolant and coupled to the plurality diode lasers to cool the plurality of diode lasers with the cryogenic coolant, and a fuel cell coupled to the plurality of diode lasers to power the plurality of diode lasers and situated to receive the cryogenic coolant from the cryogenic cooling system as fuel for the fuel cell. A method of operating a high power laser system includes cooling a plurality of diode lasers with a cryogenic cooling system circulating a cryogenic coolant, fueling a fuel cell with a portion of the cryogenic coolant circulating in the cryogenic cooling system, and powering the plurality of diode lasers with power generated by the fuel cell.

20 Claims, 3 Drawing Sheets

CRYOGENIC COOLING OF DIODE LASER WITH COOLANT RECOVERY

CROSS REFERENCE TO RELATED APPLICATION

This application claims the benefit of U.S. Provisional Application No. 62/058,527 filed on Oct. 1, 2014, and entitled "CRYOGENIC COOLING OF DIODE LASER WITH COOLANT RECOVERY," which is hereby incorporated herein by reference in its entirety.

BACKGROUND

1. Field

Generally, the field is high power diode laser systems.

2. Background

Laser technology has become more advanced in recent years leading to new applications in various technology spaces. In particular, advances in laser diodes have allowed their increased application in high power laser systems where substantial amounts of energy must be compressed into a small operating area at a large working distance, opening up the possibility to supplant or disrupt existing laser systems based on chemicals, $CO_2$, and other gases. However, for a diode laser system to remain portable, size, weight, and cost must be considered in the design. Particularly, for vehicle- or aircraft-mounted diode laser apparatuses capable of generating at least 1 kW or more of continuous laser power focusable at a particular location (such as a stationary ground target or a moving air target), laser systems should be dynamically and efficiently operable, but without being too large, too heavy, unsafe, or an excessive drain on host vehicle operation. Despite efforts to achieve such laser systems, there remains a need for systems and methods without the attendant drawbacks.

SUMMARY

Satisfying the aforementioned need, and providing the possibility of both portable and non-portable applications alike, according to some embodiments of the disclosed technology, a laser system includes a plurality of diode lasers, a cryogenic cooling system coupled to the diode lasers to provide cooling to the diode lasers with a cryogenic coolant, and a fuel cell situated to receive fuel from the cryogenic cooling system and operable to power the plurality of diode lasers. By constructing a laser system in this manner, highly efficient diode operation is achieved by cooling the diode junctions to cryogenic or other suitably cool temperatures while the same coolant is used to power one or more laser system components, such as the diode lasers and components of the cryogenic cooling system.

In some embodiments, a method of operating a high power diode laser system includes cooling a plurality of diode lasers with a cryogenic coolant, fueling a fuel cell with a portion of the cryogenic coolant, and powering the plurality of diode lasers with power generated by the fuel cell. In a further embodiment, the fuel cell is replaced with a gas turbine which supplies the power for diode laser system operation. The foregoing and other objects, features, and advantages will become more apparent from the following detailed description, which proceeds with reference to the accompanying figures, which are not necessarily drawn to scale.

DETAILED DESCRIPTION

Figure 1:
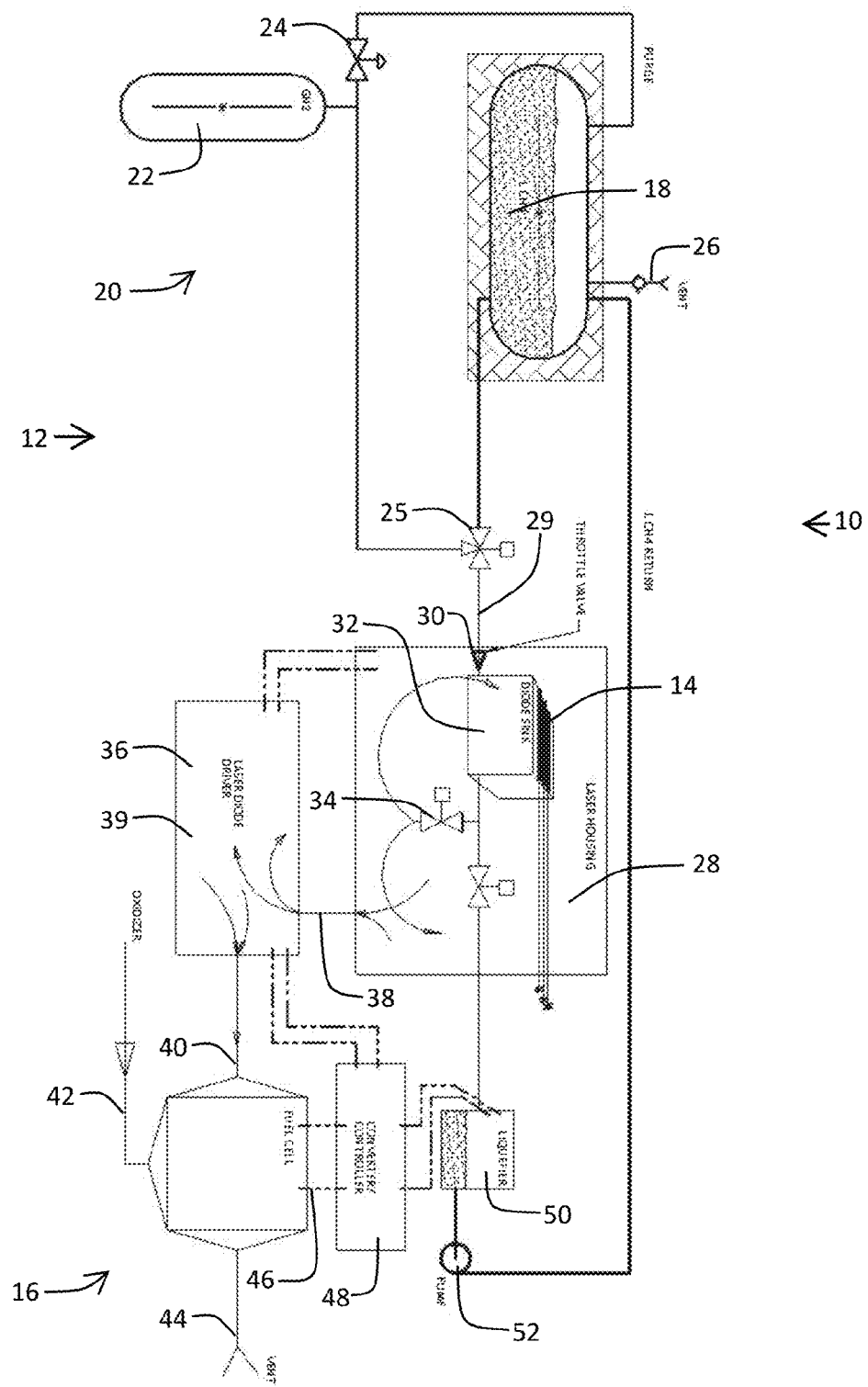
FIG. 1 is a schematic of an embodiment of a diode laser system with coolant recovery.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

As used herein, optical radiation refers to electromagnetic radiation at wavelengths of between about 100 nm and 10 µm, and typically between about 500 nm and 2 µm. Examples based on available laser diode sources and optical fibers generally are associated with wavelengths of between about 800 nm and 1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light in some examples, and need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics.

The term brightness is used herein to refer to optical beam power per unit area per solid angle. In some examples, optical beam power is provided with one or more laser diodes that produce beams whose solid angles are proportional to beam wavelength and beam area. Selection of beam area and beam solid angle can produce pump beams that couple selected pump beam powers into one or more core or cladding layers of double, triple, or other multi-clad optical fibers.

With reference to FIG. 1 there is shown a schematic of an embodiment of a high-power diode laser system 10. The high-power diode laser system 10 includes a cryogenic cooling system 12 situated to maintain a plurality of diode lasers 14 of the high-power diode laser system 10 at a suitable temperature for high power operation. In some examples the plurality of diode lasers 14 can be used to directly generate a very high intensity output laser beam, while in other examples the plurality of diode lasers 14 are used to pump one or more other lasers that are part of or coupled to the high-power diode laser system 10, such as fiber lasers and solid state lasers, which can generate very bright high-power laser beams. The wavelengths corresponding to the plurality of diode lasers 14 need not be identical, and in some examples different wavelengths are preferred. In some exemplary laser systems, output beams of 1 kW, 5 kW, 10 kW, 20 kW, 50 kW, or more can be generated.

In some embodiments, diode laser systems herein can be mounted to mobile vehicles, such as aircraft, naval craft, armored vehicles, etc. In order to enhance the portability and self-sufficiency of the high-power diode laser systems herein, the cryogenic cooling systems 12 associated with the high-power diode laser systems 10 recover coolant and also provide a fuel source for a fuel cell system 16 which can provide power to the plurality of diode lasers 14 so as to satisfy at least a portion of the power requirements associated with the plurality of diode lasers 14. In some examples, all of the power requirements of the high-power diode laser system 10 are satisfied by a power output of the fuel cell system 16. The high-power diode laser system 10 can then be provided with a power source and cooling mechanism suitable to sustain missions of longer duration without requiring refueling.

In one embodiment, the cryogenic cooling system 12 includes a reservoir 18 configured to hold cryogenic coolant such as methane in liquid phase at approximately 110 K. The reservoir 18 is coupled to a purge system 20 which is operable to replace gaseous methane, which may be occupying available volumes in the reservoir 18 and elsewhere in the high-power diode laser system 10, with a non-reactive gas, such as nitrogen. Accordingly, a storage tank 22 of gaseous nitrogen can be coupled to the purge system 20 to provide the purge gas. A purge valve 24 is coupled to the storage tank 22, or associated purge lines, and provides a way to controllably release purge gas into the reservoir 18. A reservoir vent 26 can be connected to the reservoir to allow gaseous methane and nitrogen to escape therefrom. One or more other purge valves 25 can be coupled to the storage tank 22 to provide a way to controllably release purge gas into other laser system component volumes. Purge gas can be used to maintain low dew points in various housings and volumes of the high-power diode laser system 10.

Liquid methane from the reservoir 18 is directed to a laser housing 28 via an inlet line 29. A throttle valve 30 is coupled to the inlet line 29 and provides the ability to controllably expand the liquid methane into a gaseous state at one or more selected flow rates. At relatively low pressures, including near-atmospheric ones, the change in enthalpy for methane from liquid to vapor is around 500 kJ/kg, which can be seen with reference to various engineering tables describing the thermodynamic properties of methane. One such table is on page 51 of W. C. REYNOLDS, Thermodynamic properties in SI—graphs, tables and computational equations for 40 substances, Stanford University, Department of Mechanical Engineering, Stanford, Calif., 1979, which is incorporated herein by reference. This thermodynamic process can provide a convenient thermal path for sinking heat energy generated in the process of producing the high power laser outputs associated with the plurality of diode lasers. Liquid methane or mixed phase fluid flows through base 32 of the chip mounts of the plurality of diode lasers 14 in order to provide cooling to the junctions of the plurality of diode lasers 14 and maintain the temperature of the plurality of diode lasers 14 within a predetermined range, one exemplary temperature range being between about 135 K to 155 K. The liquid methane or mixed phase fluid changes to a gas as it absorbs heat from the surrounding environment, particularly when the plurality of diode lasers 14 are energized. It will be appreciated that other temperatures can be achieved for the plurality of diode lasers 14, including non-cryogenic temperatures depending on the requirements of the high-power diode laser system 10.

By maintaining the junctions of the plurality of diode lasers 14 at a cooler temperature than, for example, ambient, a higher laser operational efficiency can be achieved which can provide more optical output at a particular power level. Further cooling and also condensation prevention is provided by a flow division valve 34 coupled to a coolant line of the cryogenic cooling system 12 which allows a portion of the gaseous methane circulating through the cryogenic cooling system 12 to flood the volume of the laser housing 28. A cold gas communication path 38 connects the laser housing 28 to an internal volume 39 of a laser diode driver 36 so as to provide cooling to the laser diode driver components which dissipate heat produced in the process of driving the plurality of diode lasers 14. Components of the laser diode driver 36 are generally maintained at a different temperature from the junctions of the plurality of diode lasers 14 and so the flow division valve 34 and cold gas communication path 38 can be controlled to provide the corresponding temperature or temperature range difference.

Methane gas channeled through the laser housing 28 of the plurality of diode lasers 14 and the internal volume 39 of the laser driver 36 can then be received by the fuel cell system 16 via a fuel inlet 40 associated with the fuel cell system 16. An oxidizer source, such as oxygen in air, is provided to the fuel cell system 16 via an oxidizer inlet 42. A vent 44 is situated to release fuel cell reaction products, which are typically water and carbon dioxide. Through the chemical fuel cell process an electrical current is produced so as to provide a fuel cell power output 46. A laser diode and cooling system controller 48 are electrically coupled to the fuel cell power output 46 to become powered, at least partially, thereby. Other components can also be powered by the fuel cell power output 46, including the laser diode driver 36, various valves and solenoids of the high-power diode laser system 10, a liquefier 50 and liquid methane return pump 52, as well as components external to the high-power diode laser system 10. The fuel cell system 16 can operate in one-cell or a multiple-cell configuration, depending on the voltage requirements of the diode lasers. While a multiple-cell configuration may be operate at lower efficiency, in one example, a moderately low fuel cell efficiency of 40% can provide approximately 25 kW of power at relatively slow fuel flow rates of near 1 gm/sec. Other components can also be included in the laser diode and cooling system controller 48 to adjust, switch, or monitor current and voltage.

Prior to operation of the plurality of diode lasers 14, the laser diode and cooling system controller 48 is typically powered to monitor and maintain safety of the high-power diode laser system 10, including the cryogenic cooling system 12, e.g., through purge or safety protocols. Power can be supplied by the host vehicle via battery, engine, or other source. Prior to operation, the diode lasers and surrounding components will typically be transitioned to a cooler temperature at a slow, controlled rate in order to prevent deleterious thermal effects to components of the high-power diode laser system 10, such as cracking, etc. This transition period can also provide gaseous coolant fuel to the fuel cell system 16 for full operational readiness of the plurality of diode lasers 14.

Coolant which is not separated off by the flow division valve 34 is controllably sent to the coolant liquefier 50 which is operable to lower the temperature of the methane gas and to convert it into a liquid state. Various types of liquefiers may be used, such as a sterling cycle cooler or mixed fluid chiller, by way of example. The return pump 52 receives the liquefied methane and pumps it back to the reservoir 18. By providing the liquefier 50, overall coolant demand is reduced as excess methane gas becomes liquefied and recirculated in the cryogenic cooling system 12. The additional power demand of the liquefier is also satisfied by the power output of the fuel cell system 16, which consumes a relatively small amount of the coolant during active cooling or laser operation. In some examples, about 10% of methane gas expanded after the throttle valve 30 is separated off by the flow division valve 34 for volume cooling and fuel cell fuel whereas 90% is returned to the reservoir 18 via the liquefier 50. In further examples, other percentage splits are used, such as 5%/95%, 20%/80%, etc., which can vary dynamically with respect to real-time power demand or cooling requirements of the high-power diode laser system 10, or statically in accordance with design requirements, such as output power of the plurality of diode lasers 14, junction temperature associated with the plurality of diode lasers 14, laser or cooling system volume, etc.

Figure 2:
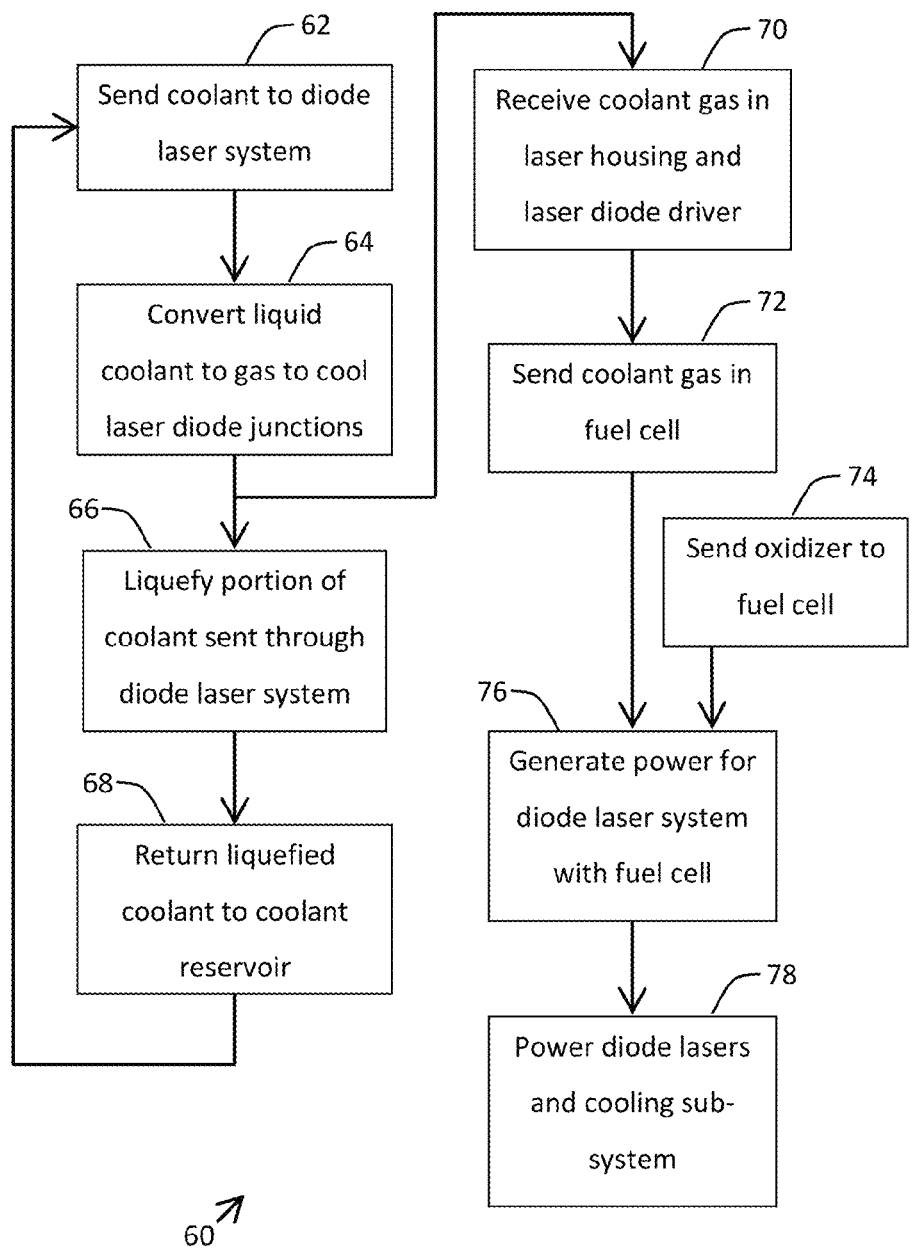
FIG. 2 is a flow chart of an embodiment of a method of cooling and powering a diode laser system.

In FIG. 2 there is shown a method embodiment 60. At step 62, coolant from a cooling system is sent to cool a high-power diode laser system situated to directly (e.g., direct diode) or indirectly (e.g., serving as a laser pump source) produce high power laser output. For example, in order to generate an output beam suitable to damage a target, continuous optical output of approximately 10 kW or more and suitably low beam parameter product may be required. Based on efficiencies of about greater than half for laser diode input power to optical output power, an input power of greater than 15 kW would be needed. The coolant received by the laser diodes from the cooling system is converted to a gas at step 64 to dissipate at least a portion of the relatively large amount of heat generated by laser diode operation due to imperfect efficiencies in beam generation and beam coupling. In some embodiments, converting the liquid coolant to a gas is effected by controllably metering an amount of liquid through a throttle valve and providing an expanded volume for coolant gas to boil into. At 66, coolant gas that has cooled the laser diodes is converted back to a liquid state, and at 68 the liquefied coolant is returned to the coolant reservoir, with a cryogenic pump, for example.

At 70, at least a portion of the coolant gas which has been expanded at step 64 is received in the laser housing of the cooled laser diodes to provide additional cooling of the diode lasers. The coolant gas can be sent to additional housings as well, such as the housing for the laser diode driver to provide cooling of the laser diode driver. At 72, the coolant gas which has flowed through the various housings is then sent to a fuel cell to fuel one or more chemical reactions associated with the fuel cell. At 74, an oxidizer such as air is sent to the fuel cell to provide the oxygen for the fuel cell, the operation of which, at 76, generates electrical power. At 78, various laser and cooling system components are powered by the electrical power generation process at 76, including the laser diodes, laser diode driver, laser controller, coolant liquefier, cooling system valves, etc.

Figure 3:
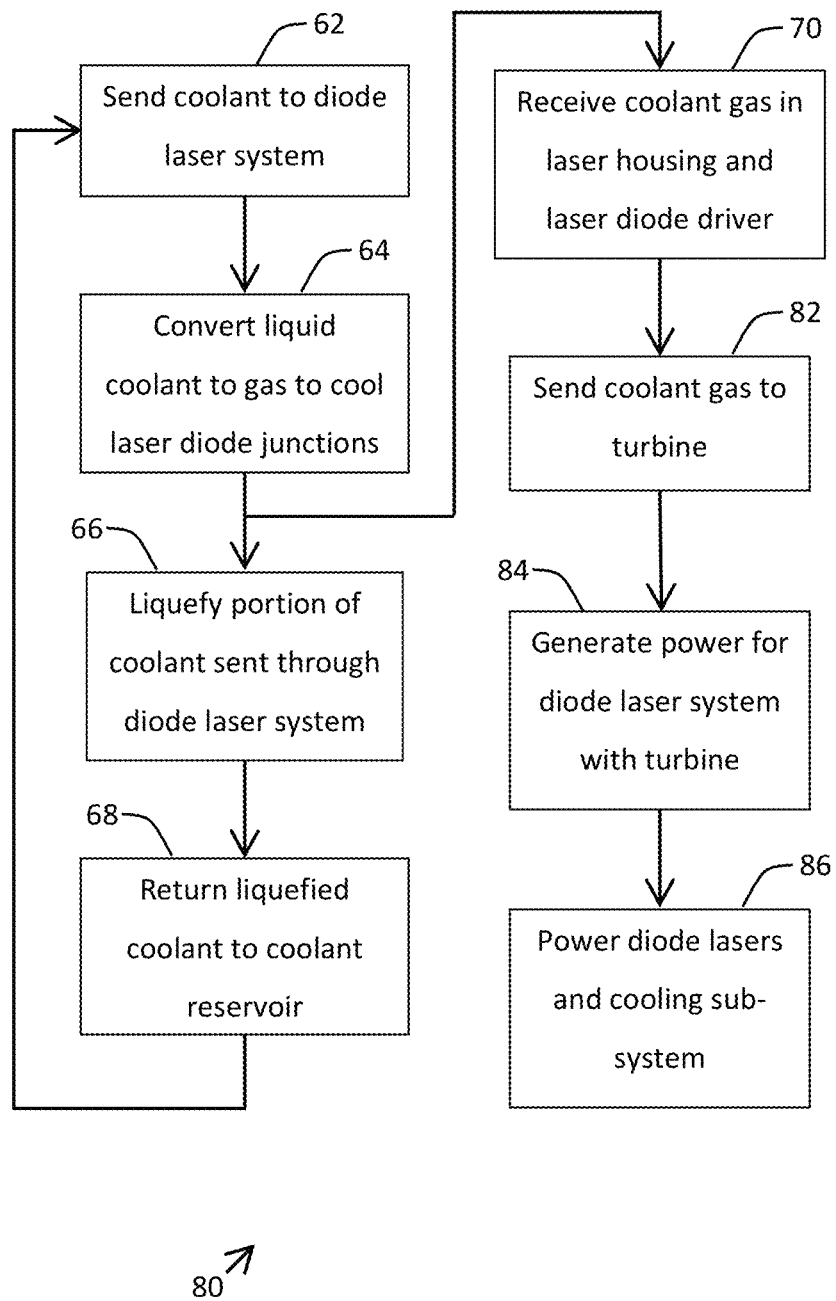
FIG. 3 is a flow chart of another embodiment of a method of cooling and powering a diode laser.

With reference to FIG. 3, there is shown another embodiment of a cooling recovery method 80. The method 80 uses similar steps as exemplary method 60, however, coolant gas is received by the open cavity of laser system housings and sent to a gas turbine, at 82. At 84, power is generated by the gas turbine using the coolant gas received. At 86 the diode lasers and cooling system are powered with the energy generated by the turbine. Turbines are generally less efficient than a fuel cell, but depending on the design constraints of the laser system, may be a viable option which utilizes a portion of the coolant gas to generate power for the laser system and corresponding components.

Having described and illustrated the principles of the disclosed technology with reference to the illustrated embodiments, it will be recognized that the illustrated embodiments can be modified in arrangement and detail without departing from such principles. Also, the technologies from any example can be combined with the technologies described in any one or more of the other examples. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

What is claimed is:

1. A laser system comprising:
   a plurality of diode lasers;
   a cryogenic cooling system circulating a cryogenic coolant and coupled to the plurality diode lasers to cool the plurality of diode lasers with the cryogenic coolant; and
   a fuel cell coupled to the plurality of diode lasers to power the plurality of diode lasers and situated to receive the cryogenic coolant from the cryogenic cooling system as fuel for the fuel cell.

2. The laser system of claim 1, wherein the cryogenic coolant is methane.

3. The laser system of claim 1, wherein the cryogenic cooling system includes coolant reservoir and a throttle valve, the throttle valve being situated to receive liquid coolant from the reservoir and situated to expand the liquid coolant into a coolant gas so as to cool diode laser junctions of the plurality of diode lasers.

4. The laser system of claim 3, wherein a portion of the coolant gas is directed into a housing of the diode lasers and is subsequently received by the fuel cell as fuel.

5. The laser system of claim 4, wherein the coolant gas in the housing prevents condensation therein.

6. The laser system of claim 4, wherein after cooling the plurality of diode lasers coolant gas which is not directed into the housing is liquefied with a liquefier and returned back to the reservoir.

7. The laser system of claim 4, further comprising a gas purge system coupled to the cryogenic cooling system, the gas purge system situated to purge coolant gas from the cooling system and from the laser housing in order to maintain low dew points therein.

8. The laser system of claim 1, wherein the fuel cell generates sufficient energy to power the plurality of diode lasers, laser drive electronics associated with the diode lasers, and laser power supplies associated with the diode lasers.

9. The laser system of claim 6, wherein the fuel cell generates sufficient energy to power the plurality of diode lasers and the liquefier.

10. The laser system of claim 1, wherein the plurality of diode lasers are situated to generate at least 1 kW of optical output.

11. The laser system of claim 1, wherein the plurality of diode lasers is powered entirely by the fuel cell.

12. A method of operating a high power laser system, the method comprising:
    cooling a plurality of diode lasers with a cryogenic cooling system circulating a cryogenic coolant;
    fueling a fuel cell with a portion of the cryogenic coolant circulating in the cryogenic cooling system; and
    powering the plurality of diode lasers with power generated by the fuel cell.

13. The method of claim 12, wherein the cryogenic coolant is methane.

14. The method of claim 13, wherein the plurality of diode lasers are cooled by controllably expanding the liquid coolant to coolant gas with a throttle valve.

15. The method of claim 14, wherein a portion of the coolant gas is directed into a laser housing of the diode lasers in order to provide further cooling and to prevent condensation.

16. The method of claim 15, wherein the coolant gas directed into the laser housing is further directed to the fuel cell to provide fuel thereto.

17. The method of claim 15, wherein the coolant gas that is not directed into the laser housing is liquefied with a liquefier and returned to a coolant reservoir.

18. The method of claim 12, wherein the fuel cell powers the plurality of diode lasers generating an optical output of at least 10 kW.

19. A method of operating a high power laser system, the method comprising:
    cooling a plurality of diode lasers with a cryogenic coolant;
    fueling a gas turbine with a portion of the cryogenic coolant; and
    powering the plurality of diode lasers with power generated by the gas turbine.

20. The method of claim 19, wherein coolant not used by the gas turbine is liquefied and recirculated to a reservoir to provide further cooling to the plurality of diode lasers.

* * * * *